US010529814B2

(12) United States Patent
Naito

(10) Patent No.: US 10,529,814 B2
(45) Date of Patent: Jan. 7, 2020

(54) SEMICONDUCTOR DEVICE

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 15/976,829

(22) Filed: May 10, 2018

(65) Prior Publication Data

US 2018/0269294 A1 Sep. 20, 2018

Related U.S. Application Data

(63) Continuation of application No. 15/333,193, filed on Oct. 25, 2016, now Pat. No. 9,991,353.

(30) Foreign Application Priority Data

Dec. 3, 2015 (JP) .................. 2015-236999

(51) Int. Cl.
*H01L 29/732* (2006.01)
*H01L 29/423* (2006.01)
(Continued)

(52) U.S. Cl.
CPC ........ *H01L 29/4238* (2013.01); *H01L 23/528* (2013.01); *H01L 29/0696* (2013.01);
(Continued)

(58) Field of Classification Search
CPC ............. H01L 29/7823; H01L 29/7826; H01L 29/7813; H01L 29/7815; H01L 29/7811; H01L 29/66734
See application file for complete search history.

(56) References Cited

U.S. PATENT DOCUMENTS 10,090,297 B2 10/2018 Hikasa
2006/0286751 A1 12/2006 Urakami et al.
(Continued)

FOREIGN PATENT DOCUMENTS

JP 2002-100770 A 4/2002
JP 2010-050211 A 3/2010
(Continued)

OTHER PUBLICATIONS

Office Action issued for counterpart U.S. Appl. No. 15/333,193, issued by the US Patent and Trademark Office dated Apr. 6, 2017.
(Continued)

*Primary Examiner* — Hoang-Quan T Ho
*Assistant Examiner* — Scott Stowe

(57) ABSTRACT

Machining accuracy of an IGBT region is worsened due to a height difference caused by polysilicon. Therefore, there is a problem that characteristic variation of the IGBT increases. Provided is a semiconductor device including a semiconductor substrate; a gate wiring layer provided on a front surface side of the semiconductor substrate; and a gate structure that includes a gate electrode and is provided on the front surface of the semiconductor substrate. The gate wiring layer includes an outer periphery portion that is a metal wiring layer and is provided along an outer periphery of the semiconductor substrate; and an extending portion that is a metal wiring layer, is provided extending from the outer periphery portion toward a central portion of the semiconductor substrate, and is electrically connected to the gate electrode.

12 Claims, 12 Drawing Sheets

(51) Int. Cl.
   *H01L 23/528*   (2006.01)
   *H01L 29/06*    (2006.01)
   *H01L 29/417*   (2006.01)
   *H01L 29/739*   (2006.01)
   *H01L 29/40*    (2006.01)

(52) U.S. Cl.
   CPC .... *H01L 29/41708* (2013.01); *H01L 29/4236* (2013.01); *H01L 29/7397* (2013.01); *H01L 29/407* (2013.01)

(56) References Cited

U.S. PATENT DOCUMENTS

| | | | |
|---|---|---|---|
| 2009/0057756 A1* | 3/2009 | Hshieh | H01L 29/0661 257/330 |
| 2014/0054644 A1 | 2/2014 | Hikasa | |
| 2015/0145025 A1 | 5/2015 | Yoshida | |
| 2017/0243746 A1 | 8/2017 | Yilmaz | |
| 2017/0250270 A1 | 8/2017 | Yilmaz | |

FOREIGN PATENT DOCUMENTS

| | | |
|---|---|---|
| JP | 2014-053552 A | 3/2014 |
| JP | 2014060386 A | 4/2014 |
| JP | 2015065420 A | 4/2015 |
| JP | 2015103611 A | 6/2015 |

OTHER PUBLICATIONS

Office Action issued for counterpart Japanese Application No. 2015-236999, drafted by the Japan Patent Office on Aug. 15, 2019.

* cited by examiner

SEMICONDUCTOR DEVICE

CROSS-REFERENCE TO RELATED APPLICATIONS

This application is a continuation of U.S. patent application Ser. No. 15/333,193, filed on Oct. 25, 2016, which claims priority to Japanese Patent Application No. 2015-236999, filed on Dec. 3, 2015, the contents of each of which are hereby incorporated herein by reference in their entirety.

BACKGROUND

1. Technical Field

The present invention relates to a semiconductor device.

2 Related Art

Conventionally, a gate electrode and a gate wiring layer are electrically connected via polysilicon. Furthermore, a dummy gate electrode and a first floating wire are also electrically connected via polysilicon, as shown in Patent Document 1, for example.

Patent Document 1: Japanese Patent Application Publication No. 2010-50211

However, when polysilicon is provided between an electrode and a wire, a height difference occurs at the location where the polysilicon is provided. This height difference from the polysilicon causes a decrease in the machining accuracy in the IGBT (Insulated Gate Bipolar Transistor) region. As a result, there is greater variation in the IGBT characteristics.

SUMMARY

According to a first aspect of the present invention, provided is a semiconductor device comprising a semiconductor substrate, a gate wiring layer, and a gate structure. The gate wiring layer may be provided on a front surface side of the semiconductor substrate. The gate structure may be provided on the front surface of the semiconductor substrate. The gate structure may include a gate electrode. The gate wiring layer may include ab outer periphery portion and an extending portion. The outer periphery portion may be provided along an outer periphery of the semiconductor substrate. The outer periphery portion may be a metal wiring layer. The extending portion may be provided extending from the outer periphery portion toward a central portion of the semiconductor substrate. The extending portion may be a metal wiring layer that is electrically connected to the gate electrode.

The semiconductor device may further comprise a plurality of element regions and a gate trench portion. The plurality of element regions may each have the gate structure. The gate trench portion may extend from one of the element regions to another of the element regions. The extending portion of the gate wiring layer may extend in a first direction from the outer periphery portion toward the central portion between two of the element regions. The gate trench portion may extend in a second direction that is orthogonal to the first direction. The gate electrode may be embedded in the gate trench portion. The gate wiring layer may be electrically connected to the gate electrode on top of the gate trench portion between the element regions.

The semiconductor device may further comprise a dummy trench portion. The dummy trench portion may extend in the second direction. The dummy trench portion may extend at least to a second-direction end of the element regions.

The dummy trench portion may cross the gate wiring layer below the gate wiring layer extending in the first direction between the two element regions.

The gate trench portion may be provided with a U shape whose long direction is parallel to the second direction, and a short direction of the U shape extends in the first direction below the gate wiring layer. The gate wiring layer may be directly connected to the gate electrode in the gate trench portion in the short direction.

The gate trench portion may also extend in the first direction below the extending portion of the gate wiring layer. The gate wiring layer may be directly connected to the gate electrode of the gate trench portion extending in the first direction. The gate trench portion may be provided with a lattice shape formed by intersections of portions extending in the first direction and portions extending in the second direction.

The semiconductor device may further comprise an interlayer insulating film. The interlayer insulating film may be provided between the semiconductor substrate and the gate wiring layer. In a region outside of the gate trench portion and the dummy trench portion, the semiconductor substrate and the interlayer insulating film may be directly connected to each other and the interlayer insulating film may directly contact the gate wiring layer.

The extending portion of the gate wiring layer may be provided extending from one side of the outer periphery portion to another side of the outer periphery portion that is opposite the one side.

The semiconductor device may further comprise an emitter electrode provided on top of the gate structure. The emitter electrode may be distanced from the gate wiring layer and divided into a plurality of pieces.

The semiconductor device may further comprise a protective film and a metal layer. The protective film may be provided on top of the gate wiring layer. The metal layer may be electrically separated from the gate wiring layer by the protective film and may be electrically connected to a plurality of the emitter electrodes on top of the plurality of emitter electrodes.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
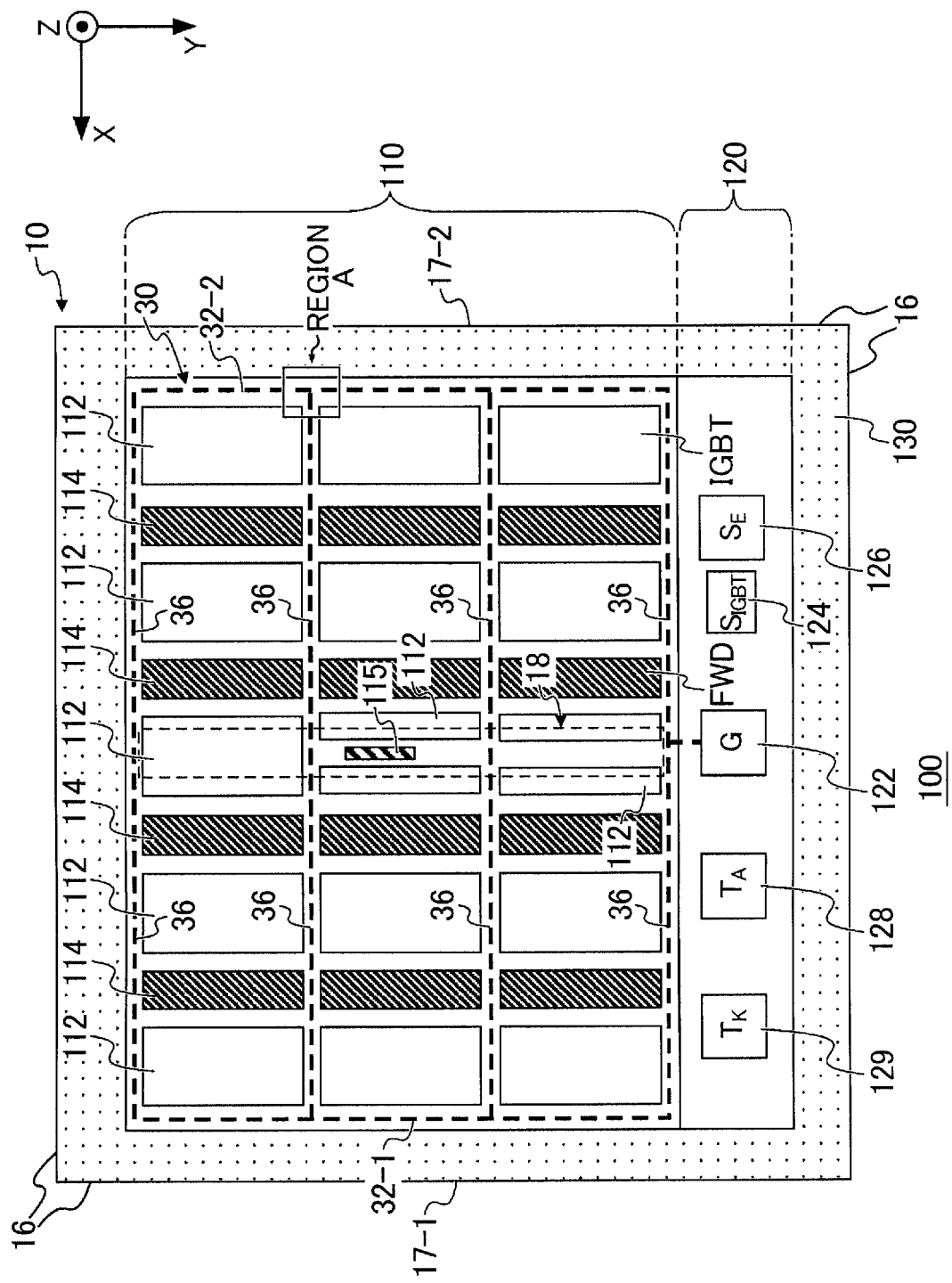
FIG. 1 is a schematic view of a top surface of a semiconductor device 100.

FIG. 1 is a schematic view of a top surface of a semiconductor device 100. The semiconductor device 100 of this example includes a semiconductor substrate 10. The semiconductor substrate 10 has an outer periphery 16 at X-direction ends and Y-direction ends thereof. The semiconductor substrate 10 has a front surface in the +Z direction and a back surface in the −Z direction. In this example, the X direction and Y direction are perpendicular to each other, and the Z direction is perpendicular to the X-Y plane. The X direction, Y direction, and Z direction form a so-called right hand system.

The semiconductor substrate 10 includes an active region 110, a pad region 120, and an edge termination region 130. The active region 110 includes a plurality of IGBT regions 112 formed as element regions and a plurality of FWD (Free Wheel Diode) regions 114. In this example, the IGBT regions 112 are arranged along the Y direction. The FWD regions 114 are also arranged along the Y direction. Furthermore, the IGBT regions 112 and the FWD regions 114 are arranged along the X direction in an alternating manner.

The central portion 18 of the semiconductor substrate 10 includes a plurality of the IGBT regions 112 and a temperature sensing diode 115. The central portion 18 of this example is shown by the square frame drawn with a dotted line in FIG. 1. In this example, several IGBT regions 112 in the central portion 18 have smaller surface areas than the IGBT regions 112 outside of the central portion 18. In this example, two IGBT regions 112 in the central portion 18 are provided in a manner to sandwich the temperature sensing diode 115 in the X direction.

A gate wiring layer 30 is provided on the front surface side of the semiconductor substrate 10 in this example. In FIG. 1, the gate wiring layer 30 is shown by a fat dotted line. The gate wiring layer 30 has an outer periphery portion 32 and an extending portion 36. The outer periphery portion 32 is provided along the outer periphery 16 of the semiconductor substrate 10. The outer periphery portion 32 of this example has an outer periphery portion 32-1 that is parallel to a side 17-1 of the outer periphery 16 that is parallel to the Y direction, and an outer periphery portion 32-2 that is parallel to another side 17-2 that is also parallel to the Y direction. The other side 17-2 is opposite the side 17-1 in the X direction. Accordingly, one side of the outer periphery portion 32 (the outer periphery portion 32-1) is opposite the other side (the outer periphery portion 32-2).

The extending portion 36 is provided extending from the outer periphery portion 32 toward the central portion 18. In this example, two extending portions 36 extend between two IGBT regions and between two FWD regions arranged in the Y direction. Furthermore, another extending portion 36 extends along the −Y-direction end of the active region 110. Yet another extending portion 36 extends between the active region 110 and the pad region 120. The extending portions 36 of this example are provided extending from one side of the outer periphery portion 32 (the outer periphery portion 32-1) to another side of the outer periphery portion 32 (the outer periphery portion 32-2).

The pad region 120 includes a gate pad 122, a sense IGBT 124, a sense emitter pad 126, a temperature sense diode anode pad 128, and a temperature sense diode cathode pad 129. The letter G in the drawing indicates the gate pad 122. The gate wiring layer 30 is electrically connected to the gate pad 122.

The label $S_{IGBT}$ in the drawing indicates the sense IGBT 124. The sense IGBT 124 is an IGBT provided for the purpose of detecting the main current flowing through the IGBT region 112. The sense current flowing through the sense IGBT 124 is taken in by a control circuit provided outside the semiconductor device 100, thereby enabling the detection of the main current flowing through the IGBT region 112. The sense current has a current value that is sufficiently small compared to the main current. The label $S_E$ in the drawing indicates the sense emitter pad 126. The sense emitter pad 126 is an electrode pad having the same potential as the emitter of the sense IGBT 124. The sense current may be taken in by the control circuit described above, through the sense emitter pad 126.

The label $T_A$ in the drawing indicates the temperature sense diode anode pad 128. The label $T_K$ in the drawing indicates the temperature sense diode cathode pad 129. By monitoring the voltage characteristics when a constant current flows through the temperature sensing diode 115, it is possible to identify the temperature of the temperature sensing diode 115. The temperature sense diode anode pad 128 and the temperature sense diode cathode pad 129 are respectively the anode pad and cathode pad of the temperature sensing diode 115. The temperature sense diode anode pad 128 and the temperature sense diode cathode pad 129 respectively have an anode potential and a cathode potential of the temperature sensing diode 115.

The edge termination region 130 is provided to surround the active region 110 and the pad region 120. In the drawing, the edge termination region 130 is indicated by a dotted region. The edge termination region 130 has a function of weakening the focusing of the electrical field on the front surface side of the semiconductor substrate 10. The edge termination region 130 has, for example, a guard ring, a field plate, a RESURF, or a structure formed by a combination of these components.

Figure 2:
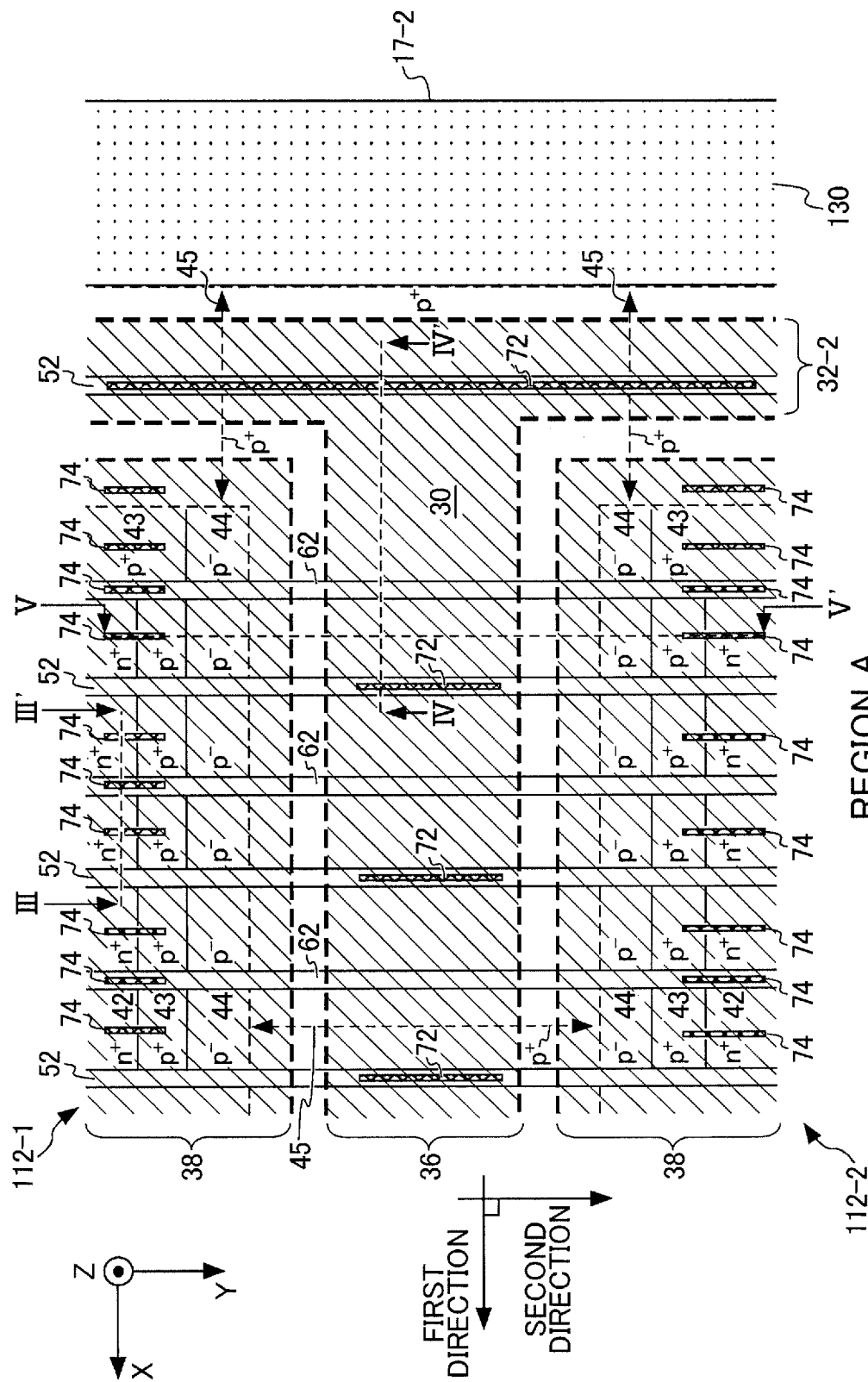
FIG. 2 is an enlarged view of the region A according to the first embodiment.

FIG. 2 is an enlarged view of the region A in the first embodiment. FIG. 2 mainly shows two IGBT regions 112 and the gate wiring layer 30. In FIG. 2, the outer shapes of the gate wiring layer 30 and the IGBT regions 112 are shown by fat dotted lines. The extending portion 36 of the gate wiring layer 30 extends in a first direction between the two IGBT regions 112. The first direction in this example is a direction from the outer periphery portion 32 of the gate wiring layer 30 toward the central portion 18 of the semiconductor substrate 10. The first direction is also parallel to the X direction. The first direction is also parallel to the gap between the two IGBT regions 112 that are adjacent in the Y direction.

Each IGBT region 112 of this example has an outer shape defined in the X-Y plane by the region where the emitter electrode 38 is provided. The emitter electrode 38 is distanced from the gate wiring layer 30 and divided into a plurality of segments. It should be noted that the IGBT region 112 may have its outer shape defined in the X-Y plane by a $p^+$-type well region 45. The $p^+$-type well region 45 is the region indicated by the arrows connected with dotted lines.

The IGBT region 112 includes gate trench portions 52 and dummy trench portions 62. The gate trench portions 52 and the dummy trench portions 62 both extend in the Y direction, and are arranged in an alternating manner in the X direction. The gate trench portions 52 and the dummy trench portions 62 extend from an IGBT region 112-1 serving as one element region to an IGBT region 112-2 serving as another element region. In other words, the gate trench portions 52 and the dummy trench portions 62 extend in a second direction. The gate trench portions 52 and dummy trench portions 62 in this example are provided in a manner to cross the gate wiring layer 30 under the gate wiring layer 30.

The second direction in this example is orthogonal to the first direction. The second direction is also parallel to the Y direction. The second direction can be represented as a direction parallel to the gap between an IGBT region 112 and a FWD region 114 adjacent to this IGBT region 112 in the X direction. Although not shown, the region of the FWD regions 114 may be defined as a range that does not include gate trench portions 52 and has only dummy trench portions 62 provided in the X direction. The Y-direction ends of the FWD regions 114 may be defined as a range in which the $p^+$-type well regions 45 or the emitter electrode 38 are provided, in the same manner as the IGBT regions 112.

The gate trench portions 52 and dummy trench portions 62 are grooved portions provided in the semiconductor substrate 10. Each gate trench portion 52 includes a gate electrode that is electrically connected to the gate wiring layer 30. The gate wiring layer 30 is electrically connected to the gate electrode on the gate trench portion 52 between the IGBT region 112-1 and the IGBT region 112-2. In this example, the gate electrode of the gate trench portion 52 and the extending portion 36 of the gate wiring layer 30 are electrically connected at a gate contact portion 72. The gate electrode is further described using FIG. 3.

The gate electrode of the gate trench portion 52 that is closest to the other side 17-2 and the outer periphery portion 32-2 of the gate wiring layer 30 are electrically connected at a gate contact portion 72. The gate contact portion 72 is an opening in the interlayer insulating film. The interlayer insulating film is an insulating film provided between the gate electrode and the gate wiring layer 30.

The outer periphery portion 32 and the extending portion 36 of the gate wiring layer 30 are metal wiring layers. The gate wiring layer 30 in this example is a wiring layer including aluminum (Al). As another example, the gate wiring layer 30 may include a so-called barrier metal layer made of molybdenum (Mo), titanium (Ti), Tungsten (W), or the like, in addition to the aluminum. In this example, the width of the extending portion 36 in the Y direction is 20 μm.

In this example, the gate electrodes and the gate wiring layer 30 made of metal are electrically connected to each other without polysilicon interposed therebetween. In this way, it is possible to eliminate the problem of the IGBT region 112 machining accuracy being reduced because of a height difference due to the polysilicon. Therefore, it is possible to reduce the variation in the characteristics of the IGBT.

Each dummy trench portion 62 includes a trench electrode that is electrically connected to the emitter electrode 38. In this example, the trench electrode of the dummy trench portion 62 and the emitter electrode 38 are electrically connected to each other at the emitter contact portion 74. The interlayer insulating film is provided between the trench electrode and the emitter electrode 38. The emitter contact portion 74 is an opening in the interlayer insulating film. The interlayer insulating film is the same as the interlayer insulating film provided between the gate electrode and the gate wiring layer 30.

Each IGBT region 112 has an emitter region 42, a contact region 43, and a base region 44. The emitter region 42 is an $n^+$-type impurity region. The contact region 43 is a $p^+$-type impurity region. The emitter region 42 and the contact region 43 are provided in a manner to sandwich the gate trench portion 52. The emitter region 42 and the contact region 43 are electrically connected to the emitter electrode 38 via an emitter contact portion 74. The base region 44 is a region having $p^-$-type impurities.

In this example, n and p respectively refer to a state in which electrons are the majority carrier and a state in which holes are the majority carrier. The + and − signs written to the upper right of n and p respectively mean that the carrier concentration is higher than in a case where a + sign is not written and that the carrier concentration is lower than in a case where a − sign is not written.

Figure 3:
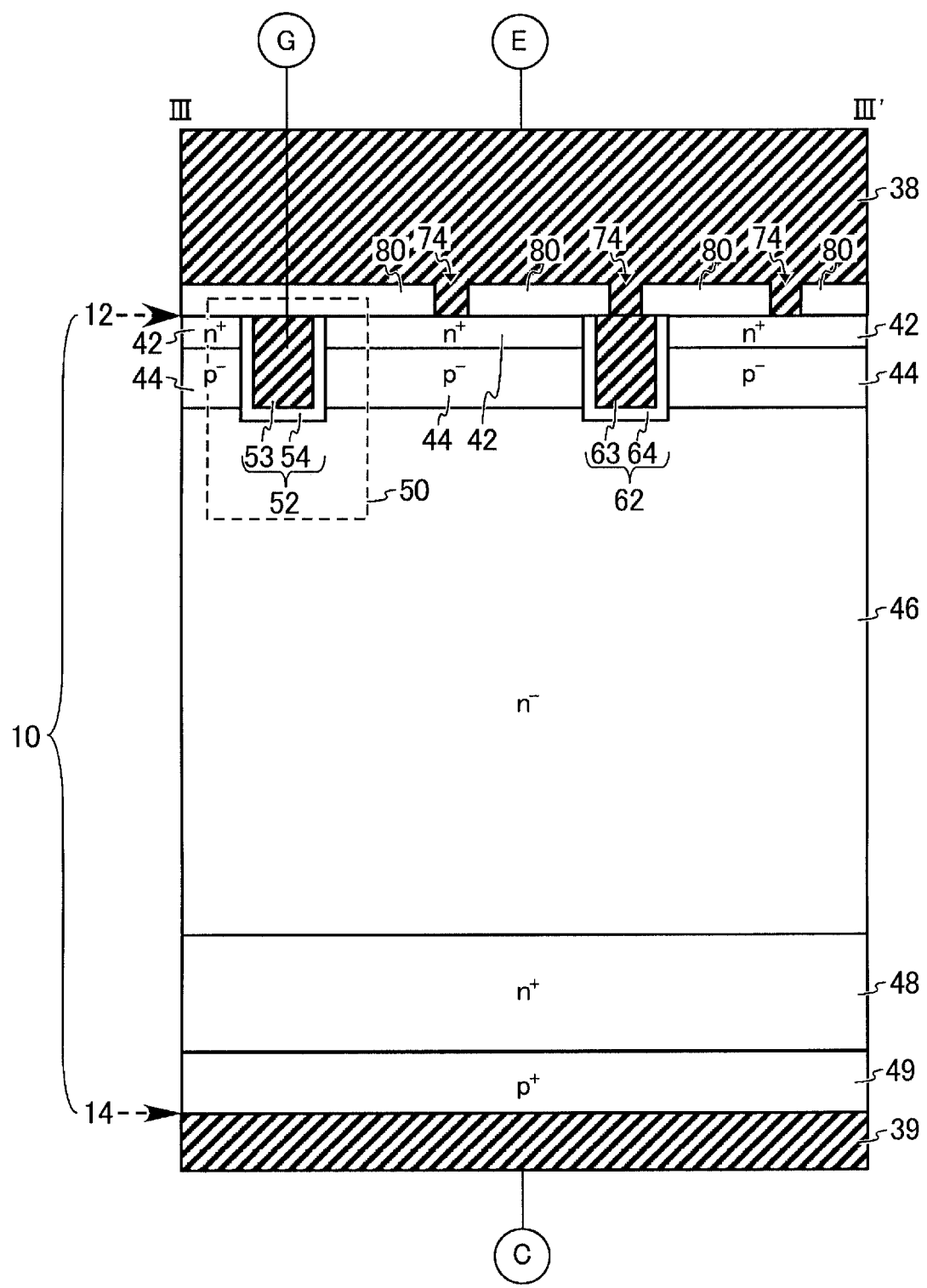
FIG. 3 shows the III-III' cross section of FIG. 2.

FIG. 3 shows the III-III' cross section of FIG. 2. FIG. 3 shows a cross section passing through three emitter contact portions 74 that are adjacent in the X direction, in a Y-direction end of an IGBT region 112. As shown in FIG. 3, the semiconductor device 100 includes an emitter electrode 38 on top of the front surface 12 and a collector electrode 39 on the bottom of the back surface 14. The gate terminal is schematically indicated by an encircled G, the emitter terminal is schematically indicated by an encircled E, and the collector terminal is schematically indicated by an encircled C. The gate terminal connects to the gate pad 122 and the emitter terminal connects to the emitter electrode 38. The collector terminal connects to the collector electrode 39 on the back surface 14.

The semiconductor substrate 10 includes a $p^+$-type collector region 49, an $n^+$-type buffer region 48, an $n^-$-type drift region 46, a $p^-$-type base region 44, and an $n^+$-type emitter region 42, in the stated order from the back surface 14 to the front surface 12.

The semiconductor device 100 also includes an interlayer insulating film 80 on top of the front surface 12 and an emitter electrode 38 on top of the interlayer insulating film 80. The interlayer insulating film 80 is provided between the emitter electrode 38 and the front surface 12 of the semiconductor substrate 10. The emitter electrode 38 and the trench electrode 63 of the dummy trench portion 62 are directly connected to each other via the emitter contact portion 74, which is an opening provided in the interlayer insulating film 80.

Each IGBT region 112 includes a gate structure 50 on the front surface 12 of the semiconductor substrate 10. The emitter electrode is positioned on top of the gate structure 50 with the interlayer insulating film 80 interposed therebetween. The gate structure 50 of this example includes a base region 44, an emitter region 42, and a gate trench portion 52. The gate trench portion 52 has a gate electrode 53 and a gate insulating film 54. The gate insulating film 54 is an insulating film formed in contact with the side walls and bottom portion of the gate trench portion 52. The gate electrode 53 is an electrode embedded in the gate trench portion 52 in contact with the gate insulating film 54. The gate electrode 53 of this example is formed of polysilicon. The gate electrode 53 is electrically connected to the gate wiring layer 30, and is electrically insulated from the emitter electrode 38 by the interlayer insulating film 80.

A prescribed voltage is applied to the emitter electrode 38 and the collector electrode 39. For example, a positive bias that is higher than the potential of the emitter electrode 38 is applied to the collector electrode 39. When the prescribed voltage is applied to the gate electrode 53, a channel is formed in the base region 44. At this time, conductivity modulation occurs in the drift region 46, and a current flows through the emitter electrode 38 from the collector electrode 39.

The structure of the dummy trench portion 62 is basically the same as that of the gate trench portion 52. The trench electrode 63 and the trench insulating film 64 of the dummy trench portion 62 correspond respectively to the gate electrode 53 and the gate insulating film 54 of the gate trench portion 52. However, the dummy trench portion 62 differs from the gate trench portion 52 in that the trench electrode 63 is electrically connected to the emitter electrode 38. The dummy trench portion 62 provides the semiconductor device 100 with a carrier injection enhancement effect (also referred to as an Injection Enhanced effect) into the drift region 46.

Figure 4:
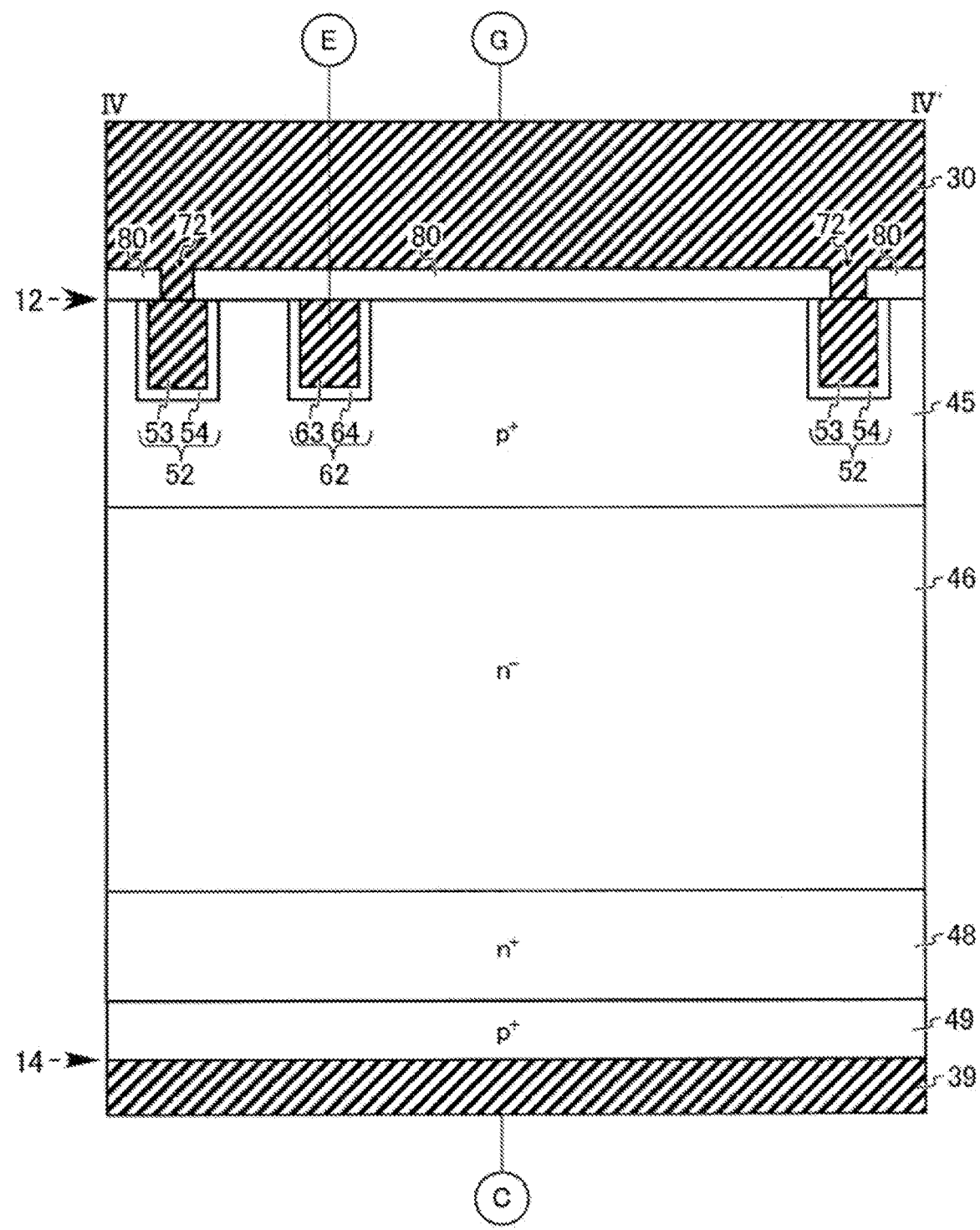
FIG. 4 shows the IV-IV' cross section of FIG. 2.

FIG. 4 shows the IV-IV' cross section of FIG. 2. FIG. 4 shows a cross section obtained by cleaving in a plane parallel to the X direction and passing through the gate trench portion 52 directly below the extending portion 36 and the gate trench portion 52 directly below the outer periphery portion 32. In FIG. 4, the region on top of the drift region 46 is a $p^+$-type well region 45. The interlayer insulating film 80 is provided between the gate wiring layer 30 and the front surface 12 of the semiconductor substrate 10. The gate electrode 53 is directly connected to the gate wiring layer 30 via the gate contact portion 72, which is an opening in the interlayer insulating film 80. The gate wiring layer 30 and the trench electrode 63 of the dummy trench portion 62 are electrically insulated from each other by the interlayer insulating film 80.

Figure 5:
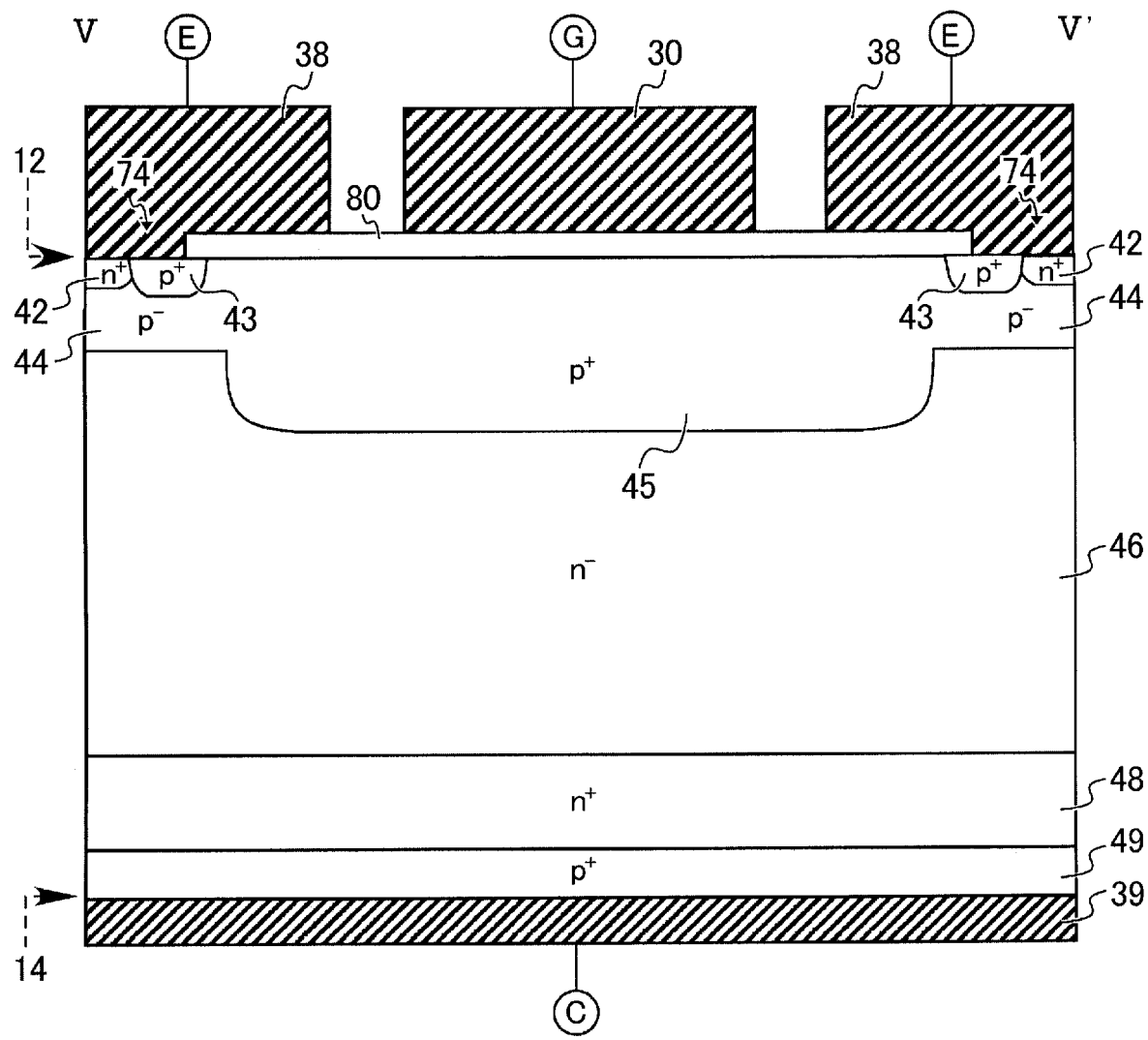
FIG. 5 shows the V-V' cross section of FIG. 2.

FIG. 5 shows the V-V' cross section of FIG. 2. FIG. 5 shows a cross section obtained by cleaving in a plane parallel to the Y direction and passing through the emitter contact portions 74 of two IGBT regions 112 and the extending portion 36 of the gate wiring layer 30. The emitter region 42 and the contact region 43 are in direct contact with the emitter electrode 38 via the emitter contact portions 74.

As shown in FIG. 5, the interlayer insulating film 80 and the front surface 12 of the semiconductor substrate 10 are in direct contact with each other in regions other than where the gate trench portions 52 and dummy trench portions 62 are located. Furthermore, in these regions, the interlayer insulating film 80 directly contacts the gate wiring layer 30. In this example, polysilicon is not interposed between the interlayer insulating film 80 and the gate wiring layer 30, and therefore the interlayer insulating film 80 is in direct contact with the gate wiring layer 30, which is a metal wiring layer, and the front surface 12 of the semiconductor substrate 10.

The following describes an exemplary manufacturing method of the semiconductor device 100 according to the first embodiment. It should be noted that the semiconductor device 100 manufacturing method is not limited to this example. Furthermore, E indicates 10 raised to a power, e.g. 1E+16 means $1\times10^{16}$.

First, the semiconductor substrate 10 having the same conductivity as the drift region 46 (n-type conductivity in this example) is prepared. Next, an etching mask with a prescribed pattern is provided on the front surface of the semiconductor substrate 10, and the grooves of the gate trench portions 52 and the dummy trench portions 62 are formed.

At this time, the mask aperture widths for forming each groove are the same. After forming the grooves, the insulating films (the gate insulating film 54 and the trench insulating film 64) are formed on the inner walls of each groove. The insulating films in this example are silicon oxide films. The grooves are respectively filled with the electrodes (the gate electrodes 53 and the trench electrodes 63) to be in contact with the respective insulating films formed on the inner walls. The electrodes in this example are polysilicon electrodes.

Next, p-type impurities are injected from the front surface 12 side of the semiconductor substrate 10, and thermal processing is performed for approximately 2 hours at a temperature of approximately 1100° C. As a result, the $p^+$-type contact region 43, the $p^-$-type base region 44, and the $p^+$-type well region 45 are each formed in the entire front surface of the semiconductor substrate 10. The p-type impurities may be boron (B). The p-type impurity doping may be performed with an impurity concentration of 3E+15 $cm^{-2}$ in the $p^+$-type contact region 43, an impurity concentration of 2.5E+13 $cm^{-2}$ in the $p^-$-type base region 44, and an impurity concentration of 5.5E+18 $cm^{-2}$ in the $p^+$-type well region 45.

Next, n-type impurities are selectively injected from the front surface 12 side of the semiconductor substrate 10, using an etching mask that has an opening corresponding to the emitter region 42. In this way, the $n^+$-type emitter region 42 is selectively formed in the base region 44. The n-type impurities may be one or more of phosphorous (P) and arsenic (As). The n-type impurity doping may be performed with an impurity concentration of 5E+19 $cm^{-2}$ in the $n^+$-type emitter region 42. After this, the interlayer insulating film 80 is formed on the front surface 12 side of the semiconductor substrate 10, and the gate contact portions 72 and emitter contact portions 74 are provided in the interlayer insulating film 80 through selective etching. After this, the gate wiring layer 30 and the emitter electrode 38 are patterned.

Next, doping with n-type impurities is performed form the back surface 14 side of the semiconductor substrate 10 to form the $n^+$-type buffer region 48. For example, ion injection may be performed a plurality of times using different dose amounts of protons, from the back surface 14 side with a concentration of approximately 1.0E+14 $cm^{-2}$. Next, thermal processing is performed at a temperature of approximately 300° C. to 400° C., thereby forming VOH defects due to the hydrogen injected according to the proton injection and the oxygen and vacancies in the semiconductor substrate 10. These VOH defects serve as donors (hydrogen donors). These hydrogen donors become the $n^+$-type buffer region 48.

Next, the $p^+$-type collector region 49 is formed by doping with p-type impurities from the back surface 14 of the semiconductor substrate 10. For example, the p-type impurities are ion-injected from the back surface 14 side with a dose amount greater than or equal to 1.0E+13 $cm^{-2}$ and less than or equal to 4.0E+13 $cm^{-2}$. After this, laser annealing is performed on the injection surface, and the p-type impurities are activated. Finally, the collector electrode 39 is formed on the back surface 14 side.

Figure 6:
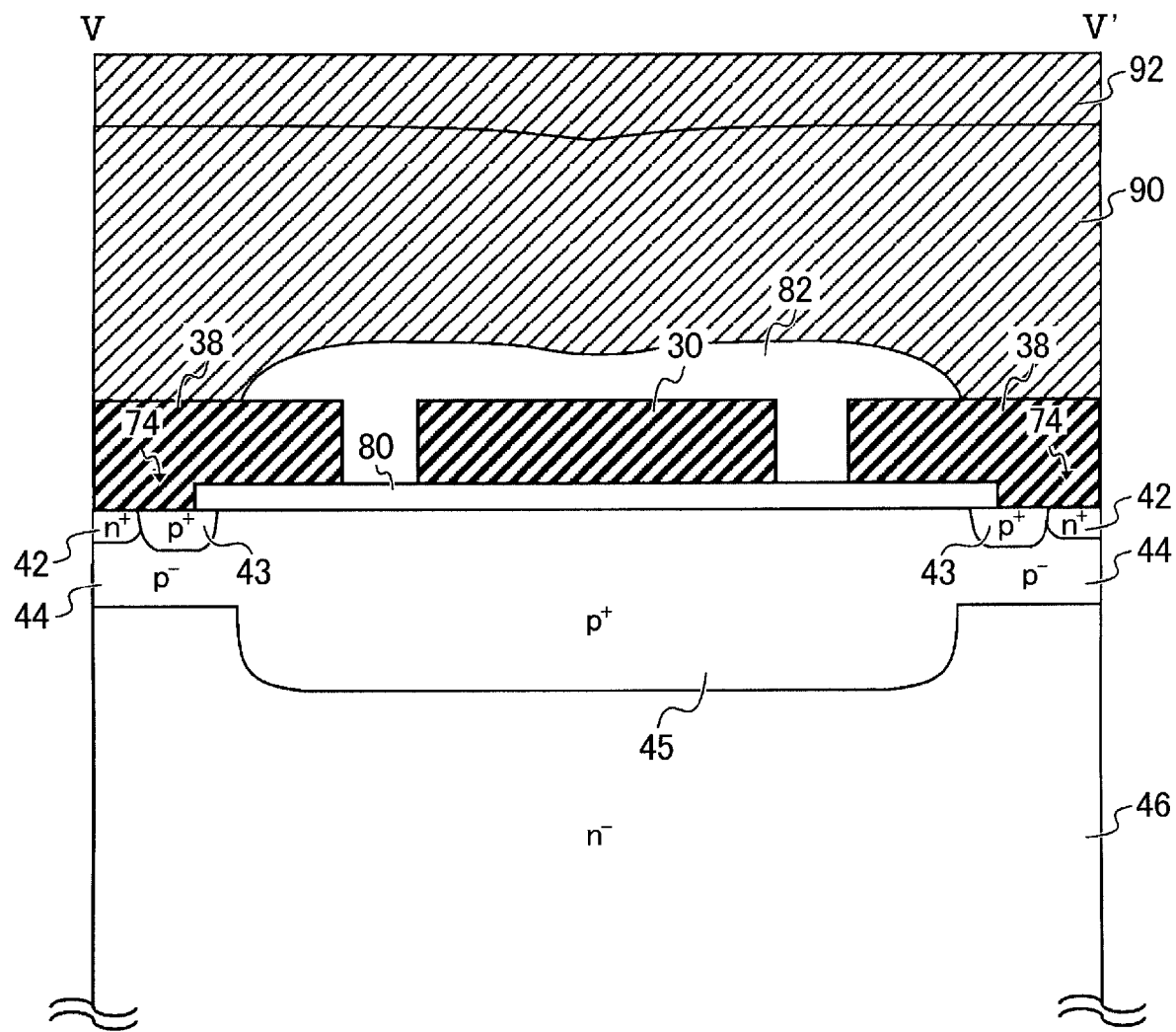
FIG. 6 shows the V-V' cross section of FIG. 2 according to the second embodiment.

FIG. 6 shows the V-V' cross section of FIG. 2 according to a second embodiment. This example further includes a protective film 82 provided on top of the gate wiring layer 30 and a metal layer 90 provided on top of the protective film 82. In this example, the emitter electrode 38 is electrically separated from the gate wiring layer 30 by the protective film 82. In this example, the thickness of the protective film 82 is 5 μm. A metal layer 90 is provided on top of a plurality of emitter electrodes 38 and electrically connected to these emitter electrodes 38. Therefore, the entire solid-film metal layer 90 provided on top of the protective film 82 functions as an emitter pad. In this way, in this example, the heat generated when the IGBT is driven can be released through the solid-film metal layer 90. Therefore, the heat can be released more efficiently than in the first embodiment.

The metal layer 90 may be a nickel (Ni) plating layer. In this example, a solder layer 92 is provided on top of the metal layer 90. Furthermore, wires or a lead frame may be electrically connected to the metal layer 90 via the solder layer 92.

Figure 7:
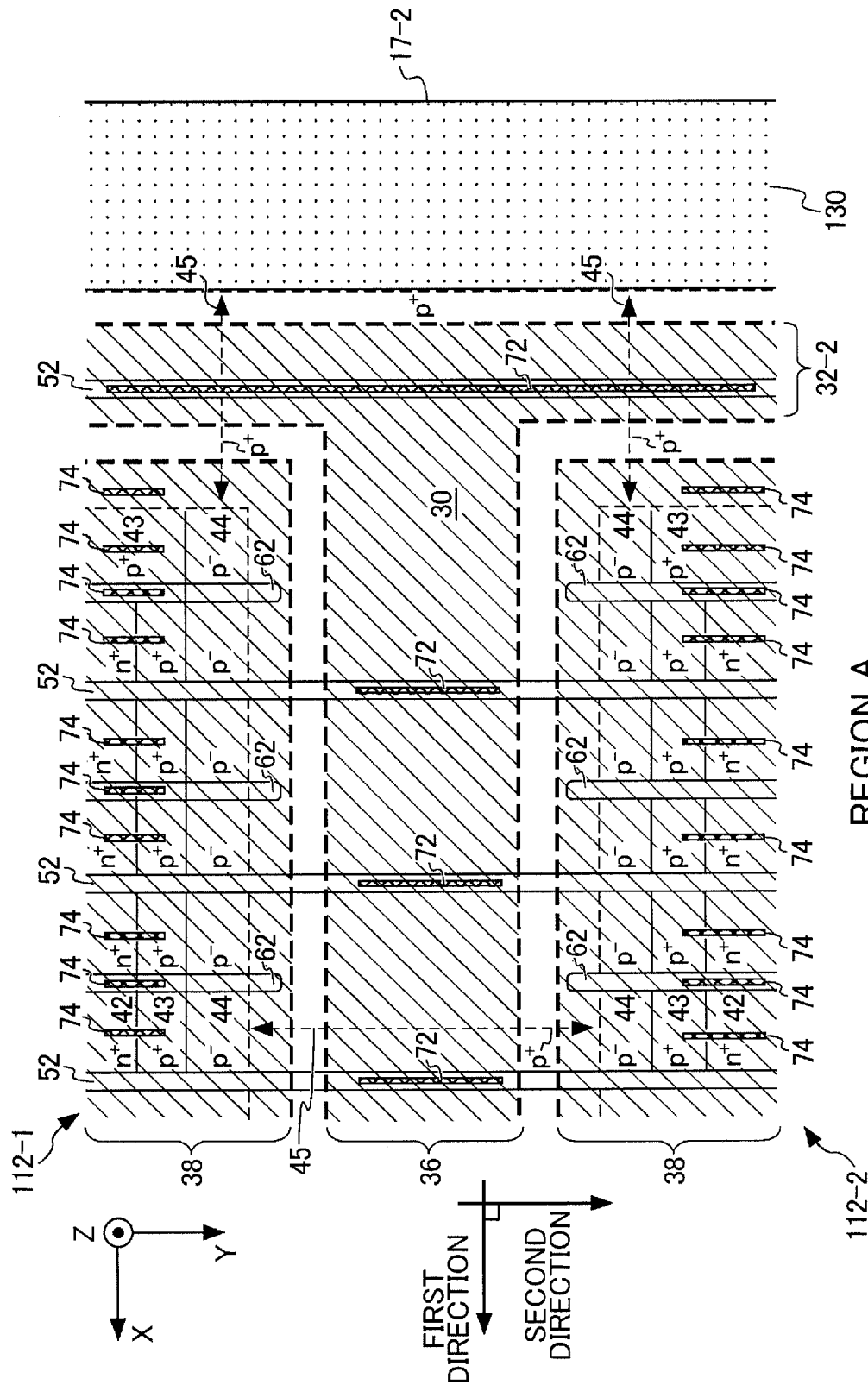
FIG. 7 is an enlarged view of the region A according to the third embodiment.

FIG. 7 is an enlarged view of the region A according to a third embodiment. The dummy trench portions 62 in this example extend to the second-direction ends of the IGBT regions 112 but do not reach the extending portion 36 of the gate wiring layer 30. In other words, each dummy trench portion 62 extends from the +Y-direction end of an IGBT region 112-1 to the −Y-direction end of an IGBT region 112-2. Therefore, in this example, it is possible to restrict the focusing of the electrical field between the dummy trench portions 62 and the emitter electrode 38. When the semiconductor device is OFF and the depletion layer expands in the drift region 46, the potential distribution is determined according to the shape of the trench electrodes 63 within the dummy trench portions 62. Each trench electrode 63 is polysilicon having an emitter potential, for example. If it were assumed that the −Z-direction end at a Y-direction end of each dummy trench portion 62 is positioned adjacent to the drift region 46, the electrical field would be focused at this location. Therefore, the Y-direction ends of the dummy trench portions 62 are provided at the position of the p-type well region 45, which is deeper than the dummy trench portions 62, i.e. farther in the −Z direction. As a result, the depletion layer contacts the ends of the dummy trench portions 62, and therefore it is possible to restrict the focusing of the electrical field. This example differs from the first embodiment with regard to this point. This example may be combined with the second embodiment.

Figure 8:
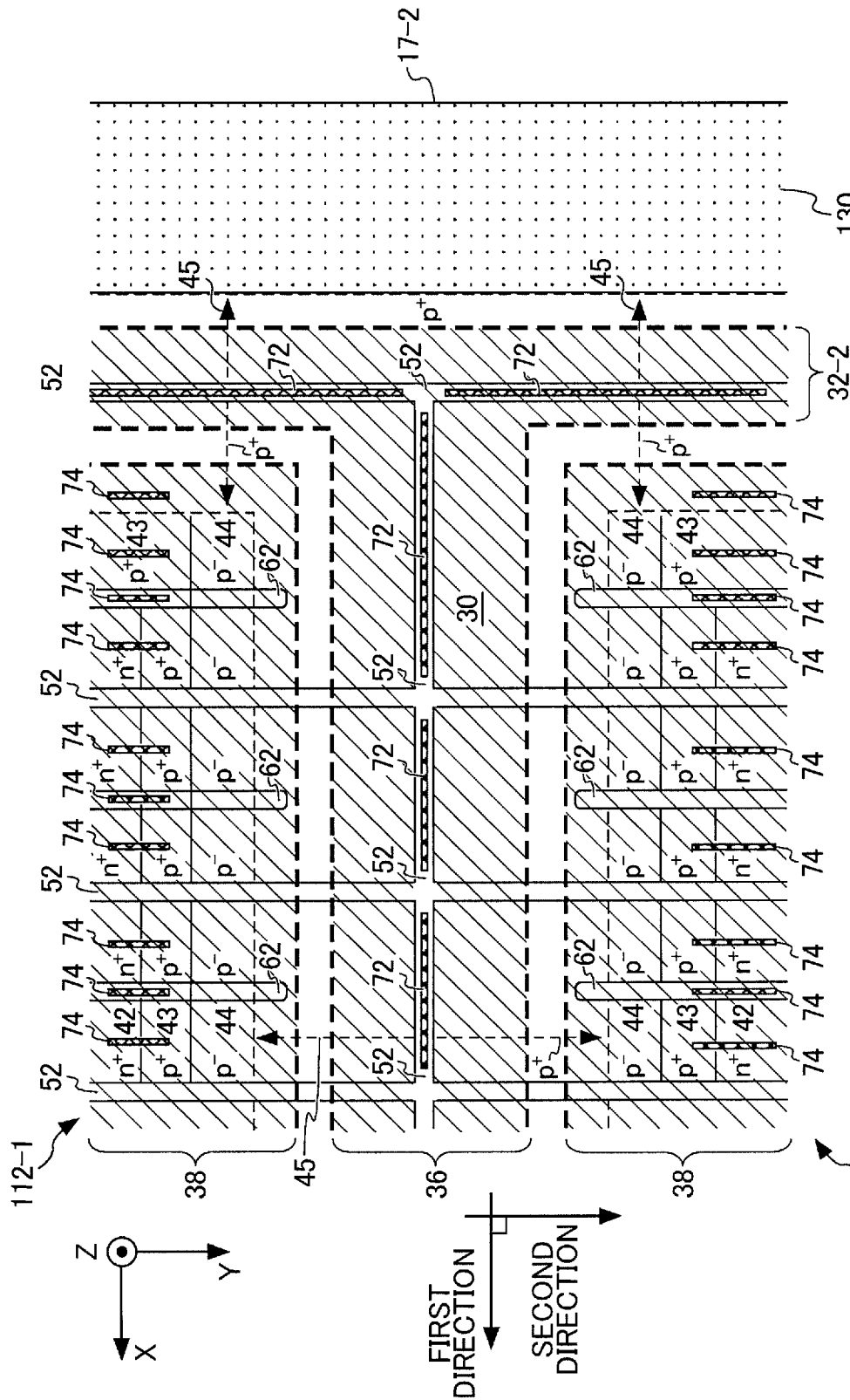
FIG. 8 is an enlarged view of the region A according to the fourth embodiment.

FIG. 8 is an enlarged view of region A according to a fourth embodiment. The gate trench portions 52 in this example extend in a first direction as well, below the extending portion 36 of the gate wiring layer 30. Furthermore, the gate trench portions 52 have portions extending in the first direction and portions extending in the second direction intersect with each other, thereby forming a lattice shape. Furthermore, the gate wiring layer 30 is directly connected to the gate electrodes 53 of the gate trench portions 52 extending in the first direction. In this example, the extending portion 36 of the gate wiring layer 30 and the gate contact portions 72 both extend in the first direction, and therefore it is possible to make the gate contact portions 72 wider than in the third embodiment. Therefore, it is possible to more reliably connect the gate wiring layer 30 to the gate electrodes 53. This example may be combined with the second embodiment.

Figure 9:
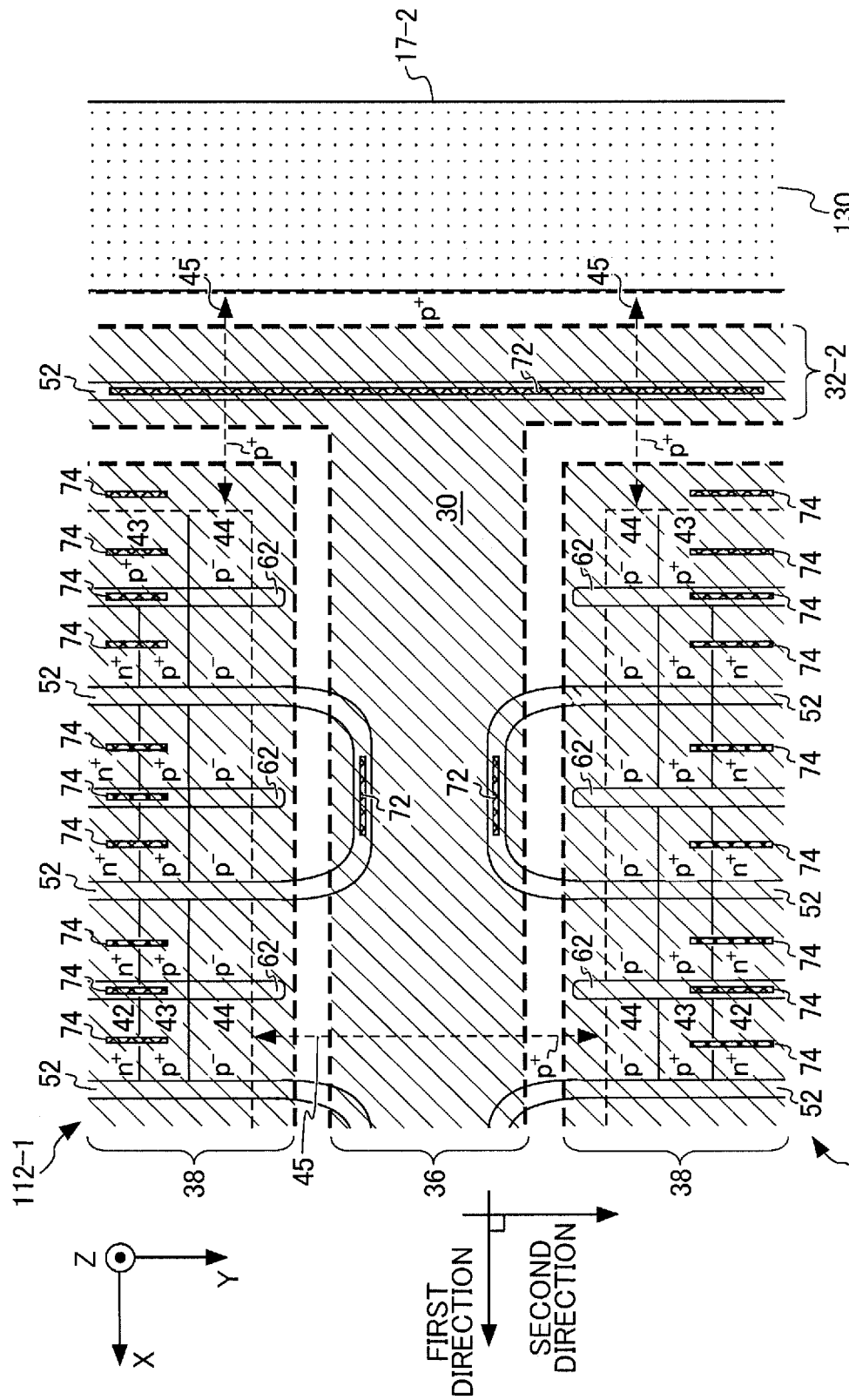
FIG. 9 is an enlarged view of the region A according to the fifth embodiment.

FIG. 9 is an enlarged view of region A according to a fifth embodiment. Each gate trench portion 52 in this example is provided with a U shape whose long direction is parallel to the second direction. In addition, the short direction of the U shape extends in the first direction below the gate wiring layer 30. The gate wiring layer 30 is directly connected to the gate electrodes 53 of the gate trench portions 52 in the short direction. This example differs from the third embodiment with regard to this point.

Figure 10:
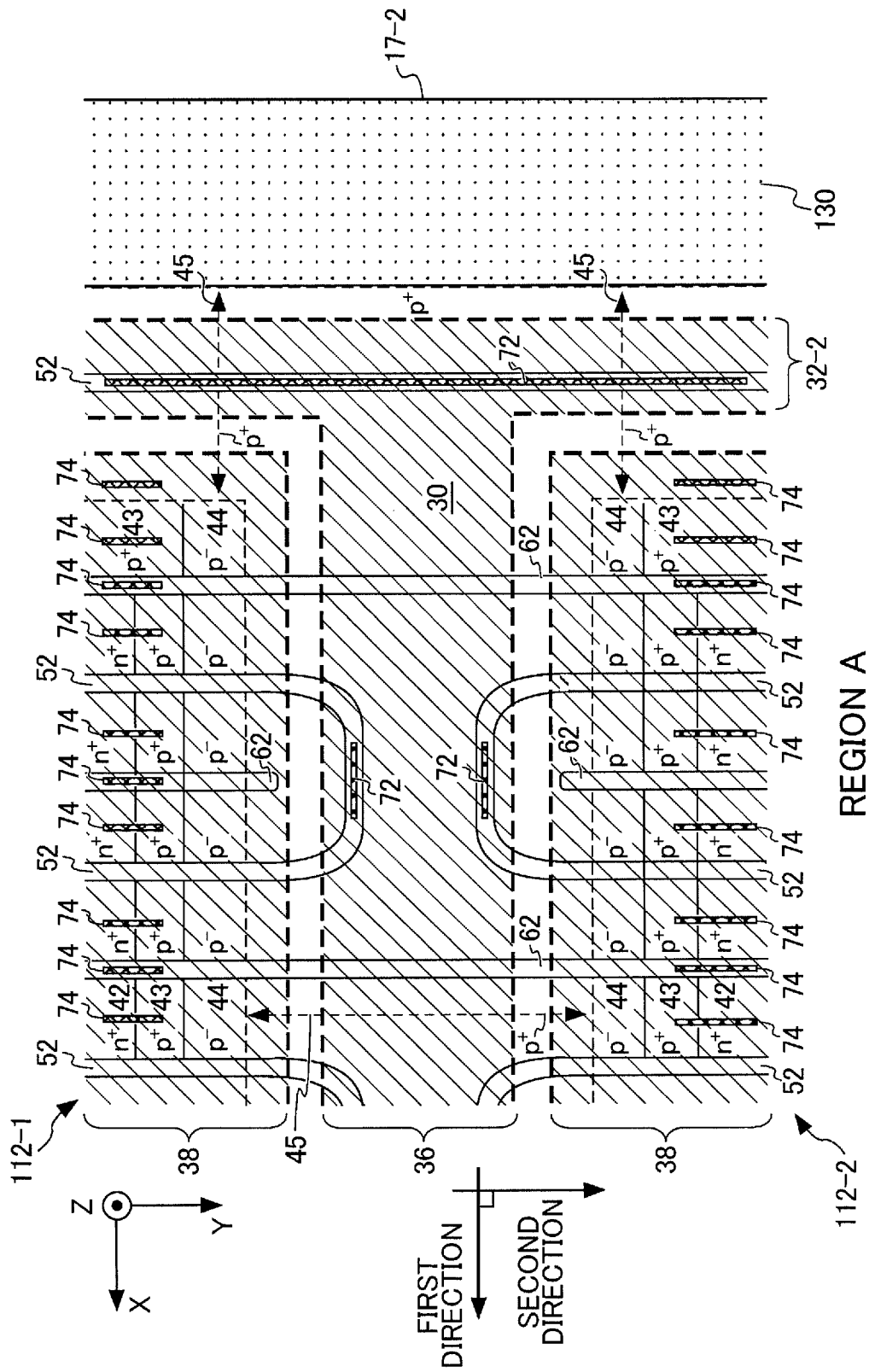
FIG. 10 is an enlarged view of the region A according to the sixth embodiment.

FIG. 10 is an enlarged view of region A according to a sixth embodiment. In this example, dummy trench portions 62 surrounded by U-shaped gate trench portions 52 extend to the second-direction ends of the IGBT regions 112. In contrast, dummy trench portions 62 that are not surrounded by U-shaped gate trench portions 52 cross the gate wiring layer 30 below the extending portion 36 of the gate wiring layer 30. This example differs from the fifth embodiment with regard to this point.

Figure 11:
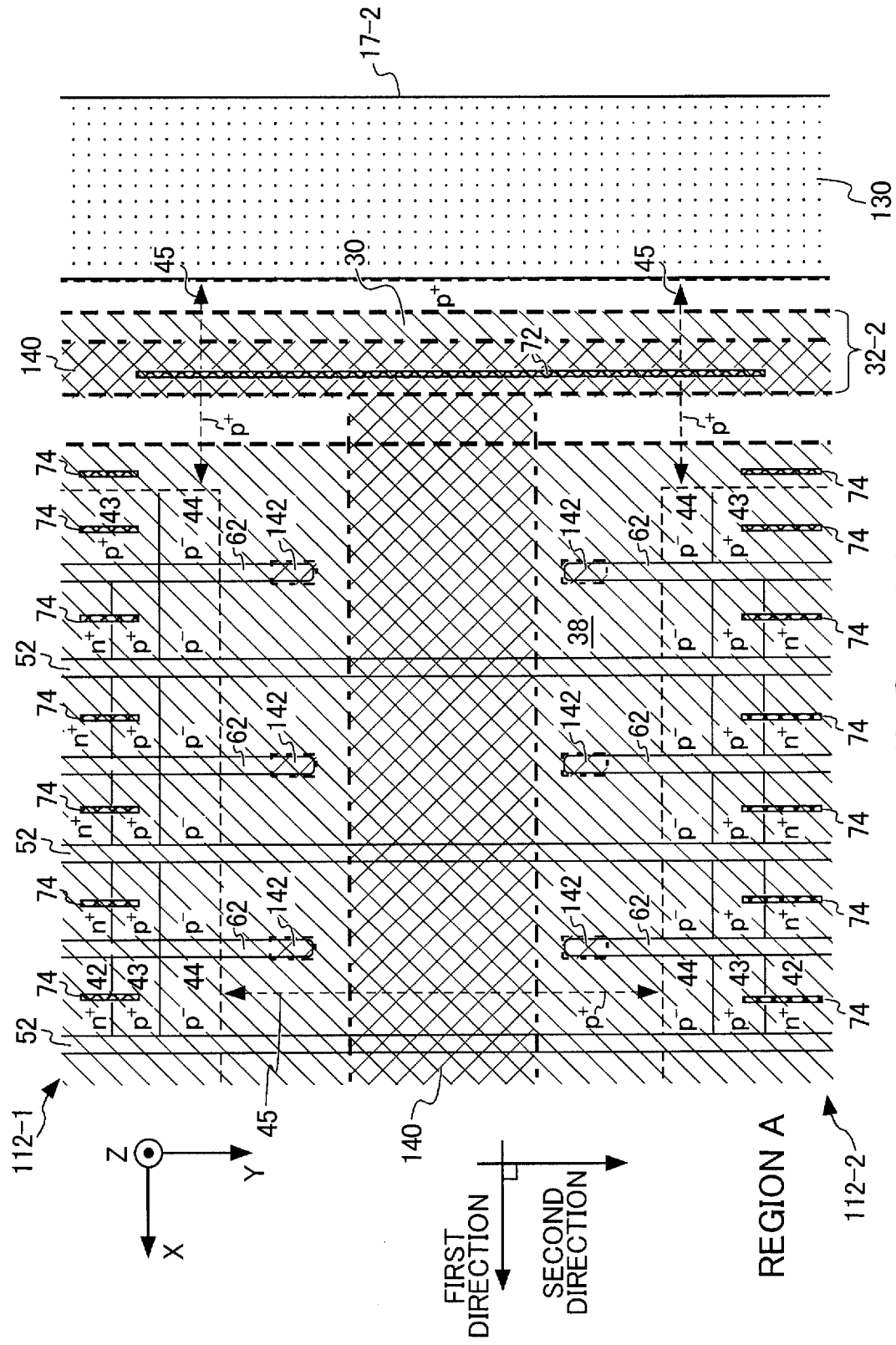
FIG. 11 shows a comparative example using polysilicon wiring.

FIG. 11 shows a comparative example using polysilicon wiring. In this example, the emitter electrode 38 is not separated between a plurality of IGBT regions 112. The emitter electrode is provided as a solid film on top of the IGBT regions 112 and FWD regions 114. The gate wiring layer 30 has an outer periphery portion 32 that extends in the second direction, but does not have the extending portion 36 extending in the first direction that is included in the first to sixth embodiments. In FIG. 11, the outer shape of the polysilicon wiring 140 is shown by semi-dotted lines. The gate wiring layer 30 and the emitter electrode 38 are shown by fat dotted lines.

The semiconductor device of the comparative example includes polysilicon wiring 140 on top of the front surface 12 of the semiconductor substrate 10. In order to transfer the gate potential, the polysilicon wiring 140 is provided from one side of the outer periphery portion 32 (the outer periphery portion 32-1) to another side (outer periphery portion 32-2) that is opposite the one side. In other words, the polysilicon wiring 140 is provided as a gate runner. In the comparative example, the polysilicon wiring 140 is shown using cross hatching.

The polysilicon wiring 140 is electrically connected to the outer periphery portion 32-2 of the gate wiring layer 30 by the gate contact portions 72. In the outer periphery portion 32-2, a p$^+$-type well region, the polysilicon wiring 140, the interlayer insulating film 80, and the metal gate wiring layer 30 are layered in the stated order from bottom to top. The polysilicon wiring 140 extends in the first direction, but is electrically insulated from the emitter electrode 38 by the interlayer insulating film 80. The polysilicon pad 142 is provided in portions at the second-direction ends of the dummy trench portions 62. The polysilicon pad 142 and the polysilicon wiring 140 are provided in the same layer. The polysilicon pad 142 is electrically connected to the emitter electrode 38 and the trench electrodes 63 of the dummy trench portions 62.

When the surface area of the front surface 12 of the semiconductor substrate 10 is greater than a prescribed surface area, the internal gate resistance between the gate electrode 53 of the IGBT regions 112 and the gate terminal becomes impossible to ignore. One idea is to decrease the internal resistance by providing the gate wiring layer 30 between a plurality of IGBT regions 112 that have been separated. In this way, current avalanche in the front surface 12 direction is prevented and breakdown of the semiconductor device 100 is restricted.

Here, the resistance factor of polysilicon is generally approximately $10^{-6}$ Ω·m, and the resistance factor of aluminum is generally approximately $10^{-8}$ Ω·m. Therefore, when the thicknesses of the wires are the same, the sheet resistance of polysilicon is 100 times greater than the sheet resistance of aluminum. As a result, in the comparative example using the polysilicon wiring 140 in the gate runner, it is necessary to increase the wire width in order to reduce the resistance value. In contrast to this, in the first to sixth embodiments, the gate wiring layer 30 made of metal such as aluminum is used, and therefore the sheet resistance is lower than the sheet resistance of the polysilicon wiring 140. Therefore, the wire width can be less than in the polysilicon wiring 140. Accordingly, in the first to sixth embodiments, it is possible to reduce the surface area occupied by wiring on the semiconductor substrate 10. Therefore, with the first to sixth embodiments, it is possible to prevent current avalanche while reducing the wire width. In other words, the chip size can be reduced.

Figure 12:
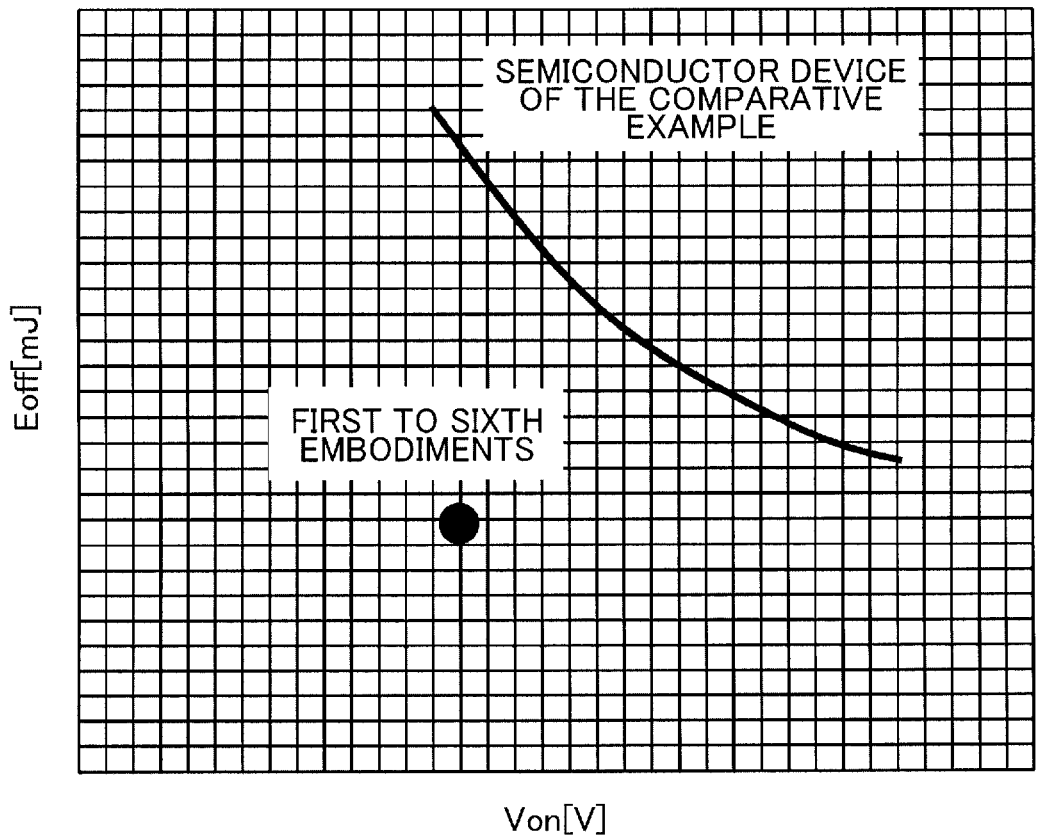
FIG. 12 shows the relationship between the ON voltage (Von) and the OFF loss (Eoff).

FIG. 12 shows the relationship between the ON voltage (Von) and the OFF loss (Eoff). The horizontal axis indicates the ON voltage [V]. The vertical axis indicates the loss [mJ] when the IGBT is switched OFF. The first to sixth embodiments include the gate wiring layer 30 having a lower resistance than the polysilicon wiring 140, and therefore it is possible to make the OFF loss and the ON voltage lower than in the comparative example. The surface area of the active region 110 in the X-Y plane is the same in the first to sixth embodiments and the comparative example. Furthermore, the Y-direction widths of the extending portions 36 of the gate wiring layers 30 in the first to sixth embodiments are the same as the Y-direction width of the first-direction extending portion of the polysilicon wiring 140 in the comparative example.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

LIST OF REFERENCE NUMERALS

10: semiconductor substrate, 12: front surface, 14: back surface, 16: outer periphery, 17: side, 18: central portion, 30: gate wiring layer, 32: outer periphery portion, 36: extending portion, 38: emitter electrode, 39: collector electrode, 42: emitter region, 43: contact region, 44: base region, 45: well region, 46: drift region, 48: buffer region, 49: collector region, 50: gate structure, 52: gate trench portion, 53: gate electrode, 54: gate insulating film, 62: dummy trench portion, 63: trench electrode, 64: trench insulating film, 72: gate contact portion, 74: emitter contact portion, 80: interlayer insulating film, 82: protective film, 90: metal layer, 92: solder layer, 100: semiconductor device, 110: active region, 112: IGBT region, 114: FWD region, 115: temperature sensing diode, 120: pad region, 122: gate pad, 124: sense IGBT, 126: sense emitter pad, 128: temperature sense diode anode pad, 129: temperature sense diode cathode pad, 130: edge termination region, 140: polysilicon wiring, 142: polysilicon pad

What is claimed is:

1. A vertical transistor comprising:
an active region of the vertical transistor formed in a semiconductor substrate of a first conductivity type, the active region comprising:
a base region of a second conductivity type,
a first vertical gate trench adjacent to the base region, and
a first gate electrode embedded entirely in the first vertical gate trench;
an edge termination region surrounding the active region, the edge termination region comprising:
a second vertical gate trench surrounding the active region around an outer periphery portion of the active region;
a second gate electrode embedded entirely in the second vertical gate trench;
a gate wiring layer formed overlying at least a portion of the active region and at least a portion of the edge termination region, the gate wiring layer electrically connecting the first gate electrode to the second gate electrode; and
a well region of the second conductivity type, the well region including at least a bottom portion of the second vertical gate trench and extending below the first vertical gate trench, the well region being deeper than the base region and having a dopant concentration that is higher than a dopant concentration of the base region.

2. The vertical transistor according to claim 1, wherein:
the first vertical gate trench is provided with a "U" shape whose long direction is orthogonal to a long direction of the gate wiring layer, and a short direction of the "U" shape extends in the long direction below the gate wiring layer; and
the gate wiring layer is directly connected to the first gate electrode in the first vertical gate trench in the short direction.

3. The vertical transistor according to claim 1, wherein:
the first vertical gate trench extends in a first direction below an extending portion of the gate wiring layer,
the gate wiring layer is directly connected to the first gate electrode of the first vertical gate trench extending in the first direction, and
the first vertical gate trench is provided with a lattice shape formed by intersections of portions extending in the first direction and portions extending orthogonal to the first direction.

4. The vertical transistor according to claim 1, further comprising:
a collector region of the second conductivity type below and vertically separated from the well region at least by a buffer region; and
a collector electrode formed on a bottom surface of the collector region.

5. The vertical transistor according to claim 1, wherein
the gate wiring layer is an emitter electrode provided on top of the first gate electrode, and
the emitter electrode is divided into a plurality of pieces.

6. The vertical transistor according to claim 5, further comprising:
a protective film on top of the emitter electrode; and
a metal layer that is electrically separated from the emitter electrode by the protective film and is electrically connected to a plurality of other emitter electrodes on top of a respective plurality of other emitter electrodes associated with other vertical transistors.

7. The vertical transistor according to claim 1, further comprising:
a dummy trench separated from the first vertical gate trench by the base region.

8. The vertical transistor according to claim 7, further comprising:
an interlayer insulating film that is provided under the gate wiring layer, wherein
in a region outside of the first vertical gate trench and the dummy trench, the interlayer insulating film directly contacts the gate wiring layer on a first surface and directly contacts the well region on a second surface opposite the first surface.

9. The vertical transistor according to claim 7, further comprising:
an interlayer insulating film in direct contact with the well region, wherein
the gate wiring layer is an emitter electrode that is provided in contact with an upper surface of the interlayer insulating film,
the emitter electrode covers a plurality of other first vertical gate trenches associated with other vertical transistors, and
in a region outside of the first vertical gate trench and the dummy trench, the interlayer insulating film directly contacts the emitter electrode.

10. The vertical transistor according to claim 9, wherein:
the well region is directly beneath the emitter electrode in an extending portion, the well region being deeper than the first vertical gate trench and the dummy trench.

11. A vertical transistor comprising:
an active region of the vertical transistor formed in a semiconductor substrate of a first conductivity type, the active region comprising:
a base region of a second conductivity type,
a first vertical gate trench adjacent to the base region, and
a first gate electrode embedded entirely in the first vertical gate trench;
an edge termination region surrounding the active region, the edge termination region comprising:
a second vertical gate trench surrounding the active region around an outer periphery portion of the active region;
a second gate electrode embedded entirely in the second vertical gate trench;
a gate wiring layer formed overlying at least a portion of the active region and at least a portion of the edge termination region, the gate wiring layer electrically connecting the first gate electrode to the second gate electrode; and
a dummy trench separated from the first vertical gate trench by the base region,
wherein the dummy trench crosses below and orthogonally to a long direction of the gate wiring layer.

12. A vertical transistor comprising:
an active region of the vertical transistor formed in a semiconductor substrate of a first conductivity type, the active region comprising:
a base region of a second conductivity type,
a first vertical gate trench adjacent to the base region, and
a first gate electrode embedded entirely in the first vertical gate trench; and
an edge termination region surrounding the active region, the edge termination region comprising:
a second vertical gate trench surrounding the active region around an outer periphery portion of the active region;
a second gate electrode embedded entirely in the second vertical gate trench; and
a gate wiring layer formed overlying at least a portion of the active region and at least a portion of the edge termination region, the gate wiring layer electrically connecting the first gate electrode to the second gate electrode,
wherein an extending portion of the gate wiring layer is provided extending from one side of the outer periphery portion of the active region to another side of the outer periphery portion of the active region opposite the one side.

* * * * *